United States Patent
Ramaswamy et al.

(10) Patent No.: US 11,476,090 B1
(45) Date of Patent: Oct. 18, 2022

(54) VOLTAGE PULSE TIME-DOMAIN MULTIPLEXING

(71) Applicant: Applied Materials, Inc., Santa Clara, CA (US)

(72) Inventors: Kartik Ramaswamy, San Jose, CA (US); Yang Yang, San Diego, CA (US); Yue Guo, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/410,803

(22) Filed: Aug. 24, 2021

(51) Int. Cl.
*H01J 37/32* (2006.01)
*H03K 3/57* (2006.01)

(52) U.S. Cl.
CPC .......... *H01J 37/32128* (2013.01); *H03K 3/57* (2013.01)

(58) Field of Classification Search
None
See application file for complete search history.

(56) References Cited

U.S. PATENT DOCUMENTS

| | | | |
|---|---|---|---|
| 4,070,589 A | 1/1978 | Martinkovic |
| 4,340,462 A | 7/1982 | Koch |
| 4,464,223 A | 8/1984 | Gorin |
| 4,504,895 A | 3/1985 | Steigerwald |
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,449,410 A | 9/1995 | Chang et al. |
| 5,451,846 A | 9/1995 | Peterson et al. |

(Continued)

FOREIGN PATENT DOCUMENTS

| CN | 101707186 B | 2/2012 |
|---|---|---|
| CN | 106206234 A | 12/2016 |

(Continued)

OTHER PUBLICATIONS

Wang, S.B., et al.—"Control of ion energy distribution at substrates during plasma processing," Journal of Applied Physics, vol. 88, No. 2, Jul. 15, 2000, pp. 643-646.

(Continued)

*Primary Examiner* — Srinivas Sathiraju
(74) *Attorney, Agent, or Firm* — Patterson + Sheridan, LLP

(57) ABSTRACT

Embodiments provided herein generally include apparatus, plasma processing systems and methods for generation of a waveform for plasma processing of a substrate in a processing chamber. One embodiment includes a waveform generator having a voltage source circuitry, a first switch coupled between the voltage source circuitry and a first output node of the waveform generator, the first output node being configured to be coupled to a chamber, and a second switch coupled between the first output node and electrical ground node. The waveform generator also includes a third switch coupled between the voltage source circuitry and a second output node of the waveform generator, the second output node being configured to be coupled to the chamber, and a fourth switch coupled between the second output node and the electrical ground node.

26 Claims, 6 Drawing Sheets

(56) References Cited

U.S. PATENT DOCUMENTS

| | | |
|---|---|---|
| 5,464,499 A | 11/1995 | Moslehi et al. |
| 5,554,959 A | 9/1996 | Tang |
| 5,565,036 A | 10/1996 | Westendorp et al. |
| 5,593,741 A * | 1/1997 | Ikeda .............. C23C 16/402 427/579 |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,392,187 B1 | 5/2002 | Johnson |
| 6,395,641 B2 | 5/2002 | Savas |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 7,016,620 B2 | 3/2006 | Maess et al. |
| 7,046,088 B2 | 5/2006 | Ziegler |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,058,156 B2 * | 11/2011 | Hanawa .......... H01J 37/32412 438/514 |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |

(56) References Cited

U.S. PATENT DOCUMENTS

| | | |
|---|---|---|
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 * | 9/2016 | Brouk ............... H01J 37/32009 |
| 9,443,700 B2 * | 9/2016 | Dorf .................. H01J 37/3233 |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,614,524 B1 * | 4/2017 | Kawasaki ......... H01J 37/32165 |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,729,122 B2 * | 8/2017 | Mavretic ................. H01L 28/40 |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 * | 9/2017 | Brouk ............... H01J 37/32935 |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |

(56) References Cited

U.S. PATENT DOCUMENTS

| | | | |
|---|---|---|---|
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapi 70nski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 * | 10/2019 | Dorf ................. H01J 37/3438 |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 * | 3/2020 | Yamada ............ H01J 37/32091 |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 * | 10/2020 | Ziemba ............ H05K 7/20254 |
| 10,811,296 B2 | 10/2020 | Cho et al. |
| 10,847,346 B2 | 11/2020 | Ziemba et al. |
| 10,861,677 B2 * | 12/2020 | Van Zyl ............ H01J 37/32045 |
| 10,892,140 B2 | 1/2021 | Ziemba et al. |
| 10,892,141 B2 * | 1/2021 | Ziemba ............ H01L 21/68757 |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 * | 2/2021 | Dorf ................. H01J 37/32174 |
| 10,923,321 B2 * | 2/2021 | Dorf ................. H01J 37/32128 |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,075,058 B2 * | 7/2021 | Ziemba ............ H02M 3/33523 |
| 11,095,280 B2 | 8/2021 | Ziemba et al. |
| 11,101,108 B2 | 8/2021 | Slobodov et al. |
| 11,108,384 B2 * | 8/2021 | Prager ..................... H03K 3/57 |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0207351 A1 * | 9/2007 | Christensen ........ H01M 8/0606<br>429/421 |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |

(56) References Cited

U.S. PATENT DOCUMENTS

| | | |
|---|---|---|
| 2008/0135401 A1 | 6/2008 | Kadlec et al. |
| 2008/0160212 A1 | 7/2008 | Koo |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman |
| 2012/0318456 A1* | 12/2012 | Brouk .............. H01J 37/32174 156/345.28 |
| 2012/0319584 A1 | 12/2012 | Brouk et al. |
| 2013/0059448 A1 | 3/2013 | Marakhtanov |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1* | 9/2014 | Deshmukh ........ H01J 37/32431 204/192.35 |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0254124 A1* | 9/2016 | Bera ................. H01J 37/32577 315/111.21 |
| 2016/0260584 A1* | 9/2016 | Marakhtanov .... H01J 37/32128 |
| 2016/0284514 A1 | 9/2016 | Hirano |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1* | 1/2018 | Brouk .............. H01J 37/32174 |
| 2018/0041183 A1* | 2/2018 | Mavretic .......... H01J 37/32183 |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |

(56) References Cited

U.S. PATENT DOCUMENTS

| | | |
|---|---|---|
| 2019/0027344 A1 | 1/2019 | Okunishi et al. |
| 2019/0080884 A1 | 3/2019 | Ziemba et al. |
| 2019/0096633 A1 | 3/2019 | Pankratz et al. |
| 2019/0115191 A1* | 4/2019 | Mavretic ........... H01L 21/31116 |
| 2019/0157041 A1 | 5/2019 | Zyl et al. |
| 2019/0157042 A1 | 5/2019 | Van Zyl et al. |
| 2019/0157044 A1 | 5/2019 | Ziemba et al. |
| 2019/0172683 A1* | 6/2019 | Mavretic ........... H01L 21/31116 |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0267212 A1* | 8/2019 | Mavretic ........... H01L 21/31116 |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0304753 A1* | 10/2019 | Leray ........................ H02J 50/20 |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0351074 A1* | 11/2019 | Ahituv ............... A61K 48/0016 |
| 2019/0363388 A1 | 11/2019 | Esswein et al. |
| 2019/0385822 A1 | 12/2019 | Marakhtanov et al. |
| 2019/0385907 A1* | 12/2019 | Gottheim ............ H01L 21/6831 |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1* | 1/2020 | Ziemba ............. H01J 37/32174 |
| 2020/0035459 A1* | 1/2020 | Ziemba ............. H01J 37/32541 |
| 2020/0036367 A1 | 1/2020 | Slobodov et al. |
| 2020/0037468 A1 | 1/2020 | Ziemba et al. |
| 2020/0051785 A1* | 2/2020 | Miller ............... H01J 37/32128 |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075290 A1* | 3/2020 | Kawasaki ......... H01J 37/32183 |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126760 A1* | 4/2020 | Ziemba ..................... H03K 3/57 |
| 2020/0126837 A1 | 4/2020 | Kuno et al. |
| 2020/0144030 A1* | 5/2020 | Prager ............... H01J 37/32128 |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1* | 6/2020 | Prager ............... H01J 37/32183 |
| 2020/0227230 A1 | 7/2020 | Ziemba et al. |
| 2020/0234921 A1* | 7/2020 | Dorf ................. H01J 37/32174 |
| 2020/0234922 A1* | 7/2020 | Dorf ................. H01J 37/32082 |
| 2020/0234923 A1* | 7/2020 | Dorf ..................... H01J 37/3299 |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1* | 11/2020 | Ziemba ............. H01J 37/32128 |
| 2020/0373114 A1 | 11/2020 | Prager et al. |
| 2020/0381214 A1* | 12/2020 | Leray ................. H01L 21/32136 |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0020410 A1* | 1/2021 | Nichols ............. H01J 37/32926 |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0059037 A1* | 2/2021 | Ye ..................... H01J 37/32128 |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1* | 4/2021 | Ziemba ............. H01J 37/32082 |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0288582 A1* | 9/2021 | Ziemba ............. H01J 37/32174 |
| 2021/0327682 A1* | 10/2021 | Ziemba ............. H01J 37/32568 |
| 2021/0399721 A1* | 12/2021 | Prager ................... H03H 11/02 |

FOREIGN PATENT DOCUMENTS

| | | |
|---|---|---|
| CN | 104752134 B | 2/2017 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 4418424 B2 | 2/2010 |
| JP | 2011035266 A | 2/2011 |
| JP | 5018244 B2 | 9/2012 |
| JP | 6741461 B2 | 8/2020 |
| KR | 20160042429 A | 4/2016 |
| WO | 2000017920 A1 | 3/2000 |
| WO | 2002059954 A1 | 8/2002 |
| WO | 2008050619 A1 | 5/2008 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2015073921 A8 | 5/2016 |
| WO | 2016131061 A1 | 8/2016 |
| WO | 2017172536 A1 | 10/2017 |
| WO | 2018048925 A1 | 3/2018 |
| WO | 2018170010 A1 | 9/2018 |
| WO | 2019036587 A1 | 2/2019 |
| WO | 2019040949 A1 | 2/2019 |
| WO | 2019099870 A1 | 5/2019 |
| WO | 2019185423 A1 | 10/2019 |
| WO | 2019225184 A1 | 11/2019 |
| WO | 2019239872 A1 | 12/2019 |
| WO | 2019245729 A1 | 12/2019 |
| WO | 2020004048 A1 | 1/2020 |
| WO | 2020017328 A1 | 1/2020 |
| WO | 2020051064 A1 | 3/2020 |
| WO | 2020121819 A1 | 6/2020 |
| WO | 2021003319 A1 | 1/2021 |
| WO | 2021062223 A1 | 4/2021 |
| WO | 2021097459 A1 | 5/2021 |
| WO | 2021134000 A1 | 7/2021 |

OTHER PUBLICATIONS

Eagle Harbor Technologies presentation by Dr Kenneth E. Miller—"The EHT Integrated Power Module (IPM): An IGBT-Based, High Current, Ultra-Fast, Modular, Programmable Power Supply Unit," Jun. 2013, 21 pages.

Eagle Harbor Technologies presentation by Dr. Kenneth E. Miller—"The EHT Long Pulse Integrator Program," ITPA Diagnostic Meeting, General Atomics, Jun. 4-7, 2013, 18 pages.

Eagle Harbor Technologies webpage—"EHT Integrator Demonstration at DIII-D," 2015, 1 page.

Eagle Harbor Technologies webpage—"High Gain and Frequency Ultra-Stable Integrators for ICC and Long Pulse ITER Applications," 2012, 1 page.

(56) References Cited

OTHER PUBLICATIONS

Eagle Harbor Technologies webpage—High Gain and Frequency Ultra-Stable Integrators for Long Pulse and/or High Current Applications, 2018, 1 page.

Eagle Harbor Technologies webpage—"In Situ Testing of EHT Integrators on a Tokamak," 2015, 1 page.

Eagle Harbor Technologies webpage—"Long-Pulse Integrator Testing with DIII-D Magnetic Diagnostics," 2016, 1 page.

Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.

Lin, Jianliang, et al.,—"Diamond like carbon films deposited by HiPIMS using oscillatory voltage pulses," Surface & Coatings Technology 258, 2014, published by Elsevier B.V., pp. 1212-1222.

Prager, J.R. et al, A High Voltage Nanosecond Pulser With Variable Pulse Width and Pulse Repetition Frequency Control for Nonequilibrium Plasma Applications, IEEE 2014, 6 pages.

Semiconductor Components Industries, LLC (SCILLC)—"Switch-Mode Power Supply" Reference Manual, SMPSRM/D, Rev. 4, Apr. 2014, On Semiconductor, 73 pages.

Sunstone Circuits—"Eagle Harbor Tech Case Study," date unknown, 4 pages.

Electrical 4 U webpage—"Clamping Circuit," Aug. 29, 2018, 1 page.

Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.

Richard Barnett et al. A New Plasma Source for Next Generation MEMS Deep Si Etching: Minimal Tilt, Improved Profile Uniformity and Higher Etch Rates, SPP Process Technology Systems. 2010.

Yiting Zhang et al. "Investigation of feature orientation and consequences of ion tilting during plasma etching with a three-dimensional feature profile simulator", Nov. 22, 2016.

S.B. Wang et al. "Ion Bombardment Energy and $SiO_2$/Si Fluorocarbon Plasma Etch Selectivity", Journal of Vacuum Science & Technology A 19, 2425 (2001).

Zhen-hua Bi et al., A brief review of dual-frequency capacitively coupled discharges, Current Applied Physics, vol. 11, Issue 5, Supplement, 2011, pp. S2-S8.

Chang, Bingdong,"Oblique angled plasma etching for 3D silicon structures with wiggling geometries" 31(8), [085301]. https://doi.org/10.1088/1361-6528/ab53fb. DTU Library. 2019.

Michael A. Lieberman, "A short course of the principles of plasma discharges and materials processing", Department of Electrical Engineering and Computer Sciences University of California, Berkeley, CA 94720.

Dr. Steve Sirard, "Introduction to Plasma Etching", Lam Research Corporation. 64 pages.

Zhuoxing Luo, B.S., M.S, "RF Plasma Etching With a DC Bias" a Dissertation in Physics. Dec. 1994.

Michael A. Lieberman, "Principles of Plasma Discharges and Material Processing", A Wiley Interscience Publication. 1994.

\* cited by examiner

VOLTAGE PULSE TIME-DOMAIN MULTIPLEXING

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma-assisted etching process to bombard a material formed on a surface of a substrate through openings formed in a patterned mask layer formed on the substrate surface.

With technology nodes advancing towards 2nm, the fabrication of smaller features with larger aspect ratios requires atomic precision for plasma processing. For etching processes where the plasma ions play a major role, ion energy control is always challenging the development of reliable and repeatable device formation processes in the semiconductor equipment industry. In a typical plasma-assisted etching process, the substrate is positioned on an electrostatic chuck (ESC) disposed in a processing chamber, a plasma is formed over the substrate, and ions are accelerated from the plasma towards the substrate across a plasma sheath, i.e., region depleted of electrons, formed between the plasma and the surface of the substrate. Traditionally RF substrate biasing methods, which use sinusoidal RF waveforms to excite the plasma and form the plasma sheath, have been unable to desirably form these smaller device feature sizes. Recently, it has been found that the delivery of high voltage pulses to one or more electrodes within a processing chamber can be useful in desirably controlling the plasma sheath formed over the surface of the substrate. However, producing moderate to high frequency high voltage pulses is challenging. Such pulse may be especially difficult to produce using standard electrical components due to the heating of switching components used to form the high voltage pulses.

Accordingly, there is a need in the art for pulsed voltage source and biasing methods that are able to enable the completion of a desirable plasma-assisted process on a substrate.

SUMMARY

Embodiments provided herein generally include apparatus, plasma processing systems and methods for generation of a waveform for plasma processing of a substrate in a processing chamber.

One embodiment of the present disclosure is directed to a waveform generator for plasma processing. The waveform generator generally includes: voltage source circuitry; a first switch coupled between the voltage source circuitry and a first output node of the waveform generator, the first output node being configured to be coupled to a chamber; a second switch coupled between the first output node and electrical ground node; a third switch coupled between the voltage source circuitry and a second output node of the waveform generator, the second output node being configured to be coupled to the chamber; and a fourth switch coupled between the second output node and the electrical ground node.

One embodiment of the present disclosure is directed to a method for waveform generation. The method generally includes: coupling, via a first switch, voltage source circuitry to a first output node of a waveform generator, the first output node being coupled to a chamber; coupling, via a second switch, the first output node to an electrical ground node; coupling, via a third switch, the voltage source circuitry to a second output node of the waveform generator, the second output node being coupled to the chamber; and coupling, via a fourth switch, the second output node to the electrical ground node.

One embodiment of the present disclosure is directed to an apparatus for waveform generation. The apparatus generally includes voltage source circuitry, one or more switches coupled to the voltage source circuitry, and a controller configured to control the one or more switches. The one or more switches includes: a first switch coupled between the voltage source circuitry and a first output node of the waveform generator, the first output node being configured to be coupled to a chamber; a second switch coupled between the first output node and electrical ground node; a third switch coupled between the voltage source circuitry and a second output node of the waveform generator, the second output node being configured to be coupled to the chamber; and a fourth switch coupled between the second output node and the electrical ground node.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

DETAILED DESCRIPTION

Some embodiments of the present disclosure are generally directed to techniques for generating a waveform for controlling ion energy distribution (IED) during plasma processing. For example, a pulsed voltage waveform may be generated by time multiplexing voltage pulses from different sources (e.g., switches) and applied to one or more electrodes in a plasma processing chamber for plasma processing. In some embodiments, the pulsed voltage waveform may be generated using multiple switch pairs, allowing for the pulsed voltage waveform to have a higher frequency as compared to conventional implementations that use a single switch pair. Due to physical and practical device limitations found in current conventional high voltage switching components, switching speeds for these conventional high voltage switches are limited to a "maximum practical switching speed" due to the heat generated in the components during use. During typical plasma processing processes, high voltage pulsed voltage waveforms that are generated by the high voltage switches typically require the switches to repeatedly perform over the lifetime of the switch containing device at voltage levels greater than about 200 volts, such as greater than about 500 volts, or greater than about 800 volts, or greater than about 1000 volts, or even greater than about 5000 volts. In one example, maximum practical switching speeds for conventional switches, such as metal-oxide-semiconductor field-effect transistors (MOSFETs), are typically limited to about 2.5 microseconds (ps) at switching voltages greater than about 800 volts. However, the use of higher frequency voltage waveforms can reduce the voltage droop during the ion current stage of a voltage pulse used during plasma processing. As a result, a narrower IED may be achieved, facilitating greater precision for plasma processing as described in more detail herein. As used herein, a voltage droop generally refers to an increase in voltage established at an electrode during a negative voltage containing portion of a voltage pulse.

Plasma Processing System Examples

Figure 1:
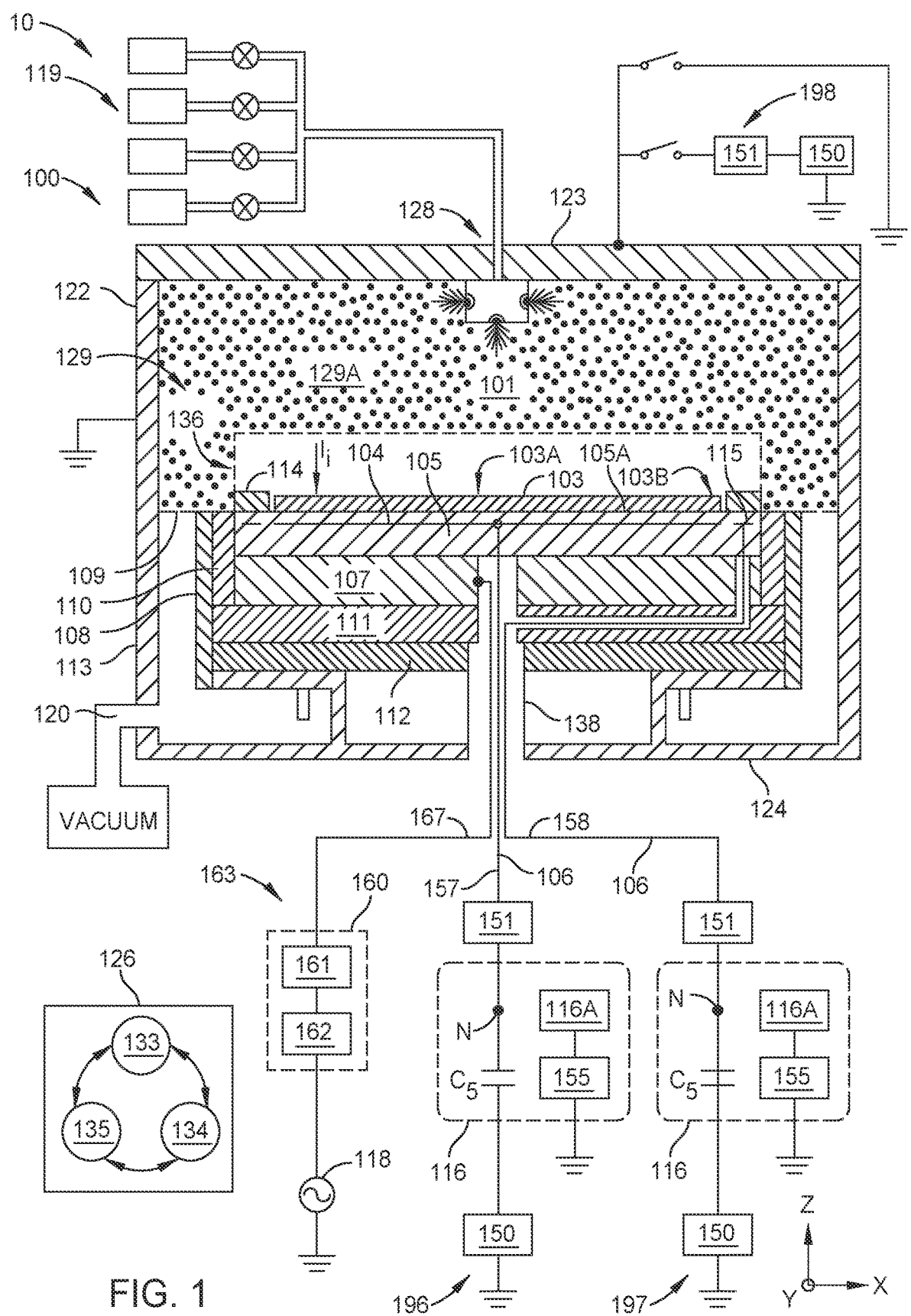
FIG. 1 is a schematic cross-sectional view of a processing system, according to one or more embodiments, configured to practice the methods set forth herein.

FIG. 1 is a schematic cross-sectional view of a processing system 10 configured to perform one or more of the plasma processing methods set forth herein. In some embodiments, the processing systems 10 is configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown, the processing system 10 is configured to form a capacitively coupled plasma (CCP), where the processing chamber 100 includes an upper electrode (e.g., chamber lid 123) disposed in a processing volume 129 facing a lower electrode (e.g., the substrate support assembly 136) also disposed in the processing volume 129. In a typical capacitively coupled plasma (CCP) processing system, a radio frequency (RF) source (e.g., RF generator 118) is electrically coupled to one of the upper or lower electrode, and delivers an RF signal configured to ignite and maintain a plasma (e.g., the plasma 101). In this configuration, the plasma is capacitively coupled to each of the upper and lower electrodes and is disposed in a processing region therebetween. Typically, the opposing one of the upper or lower electrodes is coupled to ground or to a second RF power source. In one embodiment, one or more components of the substrate support assembly 136, such as the support base 107 is electrically coupled to a plasma generator assembly 163, which includes the RF generator 118, and the chamber lid 123 is electrically coupled to ground. As shown, the processing system 10 includes a processing chamber 100, a support assembly 136, and a system controller 126.

The processing chamber 100 typically includes a chamber body 113 that includes the chamber lid 123, one or more sidewalls 122, and a chamber base 124, which collectively define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 disposed through the chamber lid 123 is used to deliver one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103.

The system controller 126, also referred to herein as a processing chamber controller, includes a central processing unit (CPU) 133, a memory 134, and support circuits 135. The system controller 126 is used to control the process sequence used to process the substrate 103, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10.

Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10 to perform the various process tasks and various process sequences used to implement the methods described herein. In one embodiment, the program includes instructions that are used to perform one or more of the operations described below in relation to FIG. 6.

The processing system may include a plasma generator assembly 163, a first pulsed voltage (PV) source assembly 196 for establishing a first PV waveform at a bias electrode 104, and a second PV source assembly 197 for establishing a second PV waveform at an edge control electrode 115. The first PV waveform or the second PV waveform may be generated using a waveform generator as described in more detail herein with respect to FIGS. 3, 4A, and 4B. In some embodiments, the plasma generator assembly 163 delivers an RF signal to the support base 107 (e.g., power electrode or cathode) which may be used to generate (maintain and/or ignite) a plasma 101 in a processing region disposed between the substrate support assembly 136 and the chamber lid 123. In some embodiments, the RF generator 118 is configured to deliver an RF signal having a frequency that is greater than 1 MHz or more, or about 2 MHz or more, such as about 13.56 MHz or more.

As discussed above, in some embodiments, the plasma generator assembly 163, which includes an RF generator 118 and an RF generator assembly 160, is generally configured to deliver a desired amount of a continuous wave (CW) or pulsed RF power at a desired substantially fixed sinusoidal waveform frequency to a support base 107 of the substrate support assembly 136 based on control signals provided from the system controller 126. During processing, the plasma generator assembly 163 is configured to deliver RF power (e.g., an RF signal) to the support base 107 disposed proximate to the substrate support 105, and within the substrate support assembly 136. The RF power delivered to the support base 107 is configured to ignite and maintain a processing plasma 101 of processing gases disposed within the processing volume 129.

In some embodiments, the support base 107 is an RF electrode that is electrically coupled to the RF generator 118 via an RF matching circuit 162 and a first filter assembly 161, which are both disposed within the RF generator assembly 160. The first filter assembly 161 includes one or more electrical elements that are configured to substantially prevent a current generated by the output of a PV waveform generator 150 from flowing through an RF power delivery line 167 and damaging the RF generator 118. The first filter assembly 161 acts as a high impedance (e.g., high Z) to the PV signal generated from a PV pulse generator P1 within the PV waveform generator 150, and thus inhibits the flow of current to the RF matching circuit 162 and RF generator 118.

In some embodiments, the RF generator assembly 160 and RF generator 118 are used to ignite and maintain a processing plasma 101 using the processing gases disposed in the processing volume 129 and fields generated by the RF power (RF signal) delivered to the support base 107 by the RF generator 118. The processing volume 129 is fluidly coupled to one or more dedicated vacuum pumps through a vacuum outlet 120, which maintain the processing volume 129 at sub-atmospheric pressure conditions and evacuate processing and/or other gases, therefrom. In some embodiments, the substrate support assembly 136, disposed in the processing volume 129, is disposed on a support shaft 138 that is grounded and extends through the chamber base 124. However, in some embodiments, the RF generator assembly 160 is configured to deliver an RF power to the bias electrode 104 disposed in the substrate support 105 versus the support base 107.

The substrate support assembly 136, as briefly discussed above, generally includes the substrate support 105 (e.g., ESC substrate support) and support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing.

Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof. In some embodiments, one or more characteristics of the RF power used to maintain the plasma 101 in the processing region over the bias electrode 104 are determined and/or monitored by measuring an RF waveform established at the bias electrode 104.

In one configuration, the bias electrode 104 is a chucking pole used to secure (i.e., chuck) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

In some embodiments, the bias electrode 104 is electrically coupled to a clamping network 116, which provides a chucking voltage thereto, such as static DC voltage between about −5000 V and about 5000 V, using an electrical conductor, such as the coaxial power delivery line 106 (e.g., a coaxial cable). As will be discussed further below, the clamping network 116 includes bias compensation circuit elements 116A, a DC power supply 155, and a bias compensation module blocking capacitor, which is also referred to herein as the blocking capacitor $C_5$. The blocking capacitor $C_5$ is disposed between the output of a pulsed voltage (PV) waveform generator 150 and the bias electrode 104.

The substrate support assembly 136 may further include the edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 1, the edge control electrode 115 is positioned within a region of the substrate support 105. In some embodiments, as illustrated in FIG. 1, the edge control electrode 115 includes a conductive mesh, foil, and/or plate that is disposed a similar distance (i.e., Z-direction) from the substrate supporting surface 105A of the substrate support 105 as the bias electrode 104. In some other embodiments, the edge control electrode 115 includes a conductive mesh, foil, and/or plate that is positioned on or within a region of a quartz pipe 110, which surrounds at least a portion of the bias electrode 104 and/or the substrate support 105. Alternately, in some other embodiments (not shown), the edge control electrode 115 is positioned within or is coupled to the edge ring 114, which is disposed on and adjacent to the substrate support 105. In this configuration, the edge ring 114 is formed from a semiconductor or dielectric material (e.g., AlN, etc.).

The edge control electrode 115 can be biased by use of a PV waveform generator that is different from the PV waveform generator 150 that is used to bias the bias electrode 104. In some embodiments, the edge control electrode 115 can be biased by use of a PV waveform generator 150 that is also used to bias the bias electrode 104 by splitting part of the power to the edge control electrode 115. In one configuration, a first PV waveform generator 150 of the first PV source assembly 196 is configured to bias the bias electrode 104, and a second PV waveform generator 150 of a second PV source assembly 197 is configured to bias the edge control electrode 115.

A power delivery line 157 electrically connects the output of the PV waveform generator 150 of the first PV source assembly 196 to an optional filter assembly 151 and the bias electrode 104. While the discussion below primarily discusses the power delivery line 157 of the first PV source assembly 196, which is used to couple a PV waveform generator 150 to the bias electrode 104, the power delivery line 158 of the second PV source assembly 197, which couples a PV waveform generator 150 to the edge control electrode 115, will include the same or similar components. The electrical conductor(s) within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e). The optional filter assembly 151 includes one or more electrical elements that are configured to substantially prevent a current generated by the output of the RF generator 118 from flowing through the power delivery line 157 and damaging the PV waveform generator 150. The optional filter assembly 151 acts as a high impedance (e.g., high Z) to RF signal generated by the RF generator 118, and thus inhibits the flow of current to the PV waveform generator 150.

The second PV source assembly 197 includes a clamping network 116 so that a bias applied to the edge control electrode 115 can be similarly configured to the bias applied to the bias electrode 104 by the clamping network 116 coupled within the first PV source assembly 196. Applying similarly configured PV waveforms and clamping voltages to the bias electrode 104 and edge control electrode 115 can help improve the plasma uniformity across the surface of the substrate during processing and thus improve the plasma processing process results.

In some embodiments, the processing chamber 100 further includes the quartz pipe 110, or collar, that at least partially circumscribes portions of the substrate support assembly 136 to prevent the substrate support 105 and/or the support base 107 from contact with corrosive processing gases or plasma, cleaning gases or plasma, or byproducts thereof. Typically, the quartz pipe 110, the insulator plate 111, and the ground plate 112 are circumscribed by a liner 108. In some embodiments, a plasma screen 109 is positioned between the cathode liner 108 and the sidewalls 122 to prevent plasma from forming in a volume underneath the plasma screen 109 between the liner 108 and the one or more sidewalls 122.

Figure 2A:
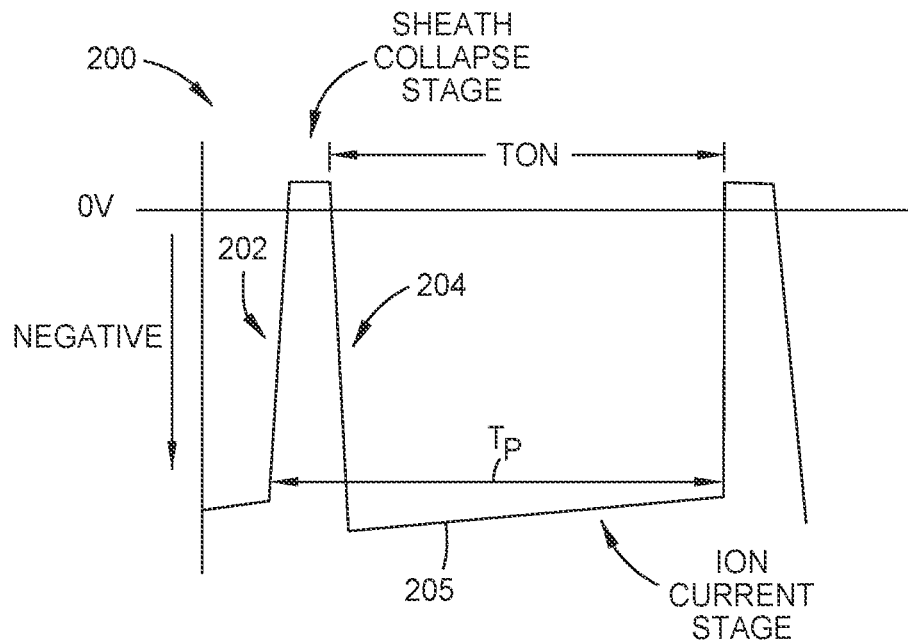
FIG. 2A illustrates a voltage waveform that is established on a substrate due to a voltage waveform applied to an electrode of a processing chamber.

FIG. 2A illustrates an example voltage waveform 200 established at a substrate in a processing chamber (e.g., processing chamber 100). In this example, the waveform 200 is generated due to the application of a waveform by the PV waveform generator 150 of the first PV source assembly 196. The waveform 200 includes an ion current stage and a sheath collapse stage, as shown. At the beginning of the ion current stage, a drop of substrate voltage, which is created by the falling edge 204, creates a high voltage sheath to form above the substrate, accelerating positive ions to the substrate. The positive ions that bombard the surface of the substrate during the ion current stage deposit a positive charge on the substrate surface, which, if uncompensated, causes a gradual increase of the substrate voltage positively (i.e., positive slope during phase 205 of the voltage waveform 200) during the ion current stage, as shown. However, the uncontrolled accumulation of positive charge on the substrate surface undesirably gradually discharges the sheath and chuck capacitors, slowly decreasing the sheath voltage drop and bringing the substrate potential closer to zero. The accumulation of positive charge results in the voltage droop (i.e., positive slope during phase 205) in the voltage waveform established at the substrate.

Figure 2B:
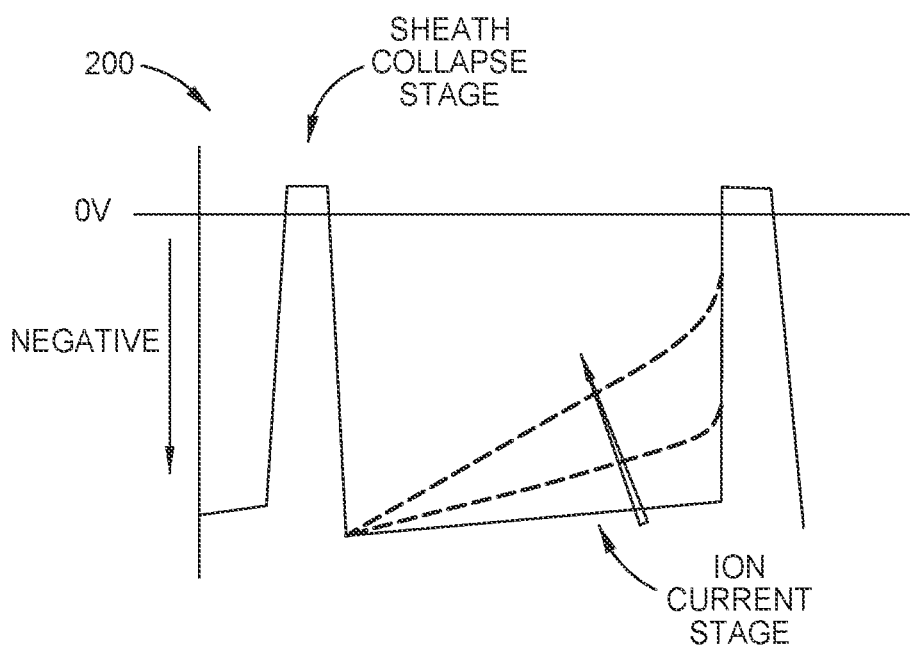
FIG. 2B illustrates the effect of increasing plasma density on a voltage waveform that is established on a substrate due to a voltage waveform applied to an electrode of a processing chamber.
Figure 2C:
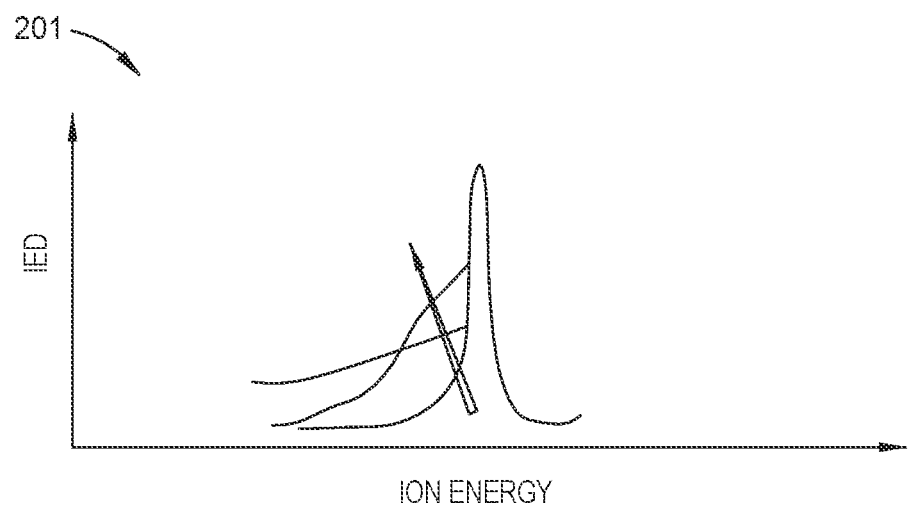
FIG. 2C illustrates the effect on an ion energy distribution (IED) associated with the effect of increasing plasma density that is illustrated in relation to the voltage waveform of FIG. 2B.

The voltage difference between the beginning and end of the ion current phase determines an ion energy distribution function (IEDF) width. FIG. 2B illustrates the effect of increasing plasma density, on a voltage waveform that is established on a substrate by use of a PV source, such as a waveform generator 150. As shown, an increase in plasma density during plasma processing (i.e., arrow highlights direction), due to changes in one or more plasma processing parameters (e.g., RF power applied by the plasma generator assembly 163), will tend to increase the voltage difference from the start to the end of the ion current stage, and thus undesirably increase the voltage droop. The greater the voltage difference, the wider the IEDF width. For example, as shown in FIG. 2C, the ion energy distribution (IED) 201 broadens with increasing ion current variation without compensation for the substrate's voltage rise. Therefore, by use of the higher frequency voltage waveforms techniques disclosed herein, the voltage droop in the voltage waveforms created by increasing plasma density during plasma processing can be reduced, which results in a narrower IED, and thus greater precision in the on-substrate plasma processing results.

In the reactor, plasma may be generated by an inductively coupled source on top of the substrate (or a peripheral coil). The coil may be placed on top of a ceramic lid (vacuum boundary), or by applying RF power to either the electrostatic chuck or a top electrode in the case of capacitively coupled plasma reactors. As described, the waveform generator (e.g., waveform generator 150 of the first PV source assembly 196) outputs a bipolar and short narrow positive pulse that transitions from a negative voltage to a positive voltage greater than zero, as shown in FIG. 2A. The duration of the positive voltage pulse is controlled and transitions back to the negative voltage baseline. The voltage stays negative and transitions back to a positive pulse at the end of the period labeled $T_{ON}$. The transition back to the positive pulse is completed during the rising edge 202 portion of the voltage waveform 200. The duration of the positive section of the pulse can be varied, and, in some embodiments, is between 1% and 20% of the waveform period ($T_p$), such as between 5% and 15% of the waveform period ($T_p$). In one example, the waveform period may be about 5 µs and the frequency of the waveform 200 may be about 200 kHz. In another example, the waveform period may be about 2.5 µs and the frequency of the waveform 200 is about 400 kHz.

During a portion of the voltage waveform, plasma bulk electrons are attracted to the substrate surface due to the rising edge 202 of the pulse step, but those electrons cannot establish a negative DC sheath potential yet as there are equal amounts of positive charge on the electrode (e.g., electrode 104). The substrate and the dielectric disposed between the electrode and the substrate supporting surface 105A form a capacitor, which has an effective capacitance $C_{esc}$, which will allow an equal amount of positive charge on the electrode to cancel the field generated by the electrons disposed on the substrate surface. At the falling edge 204 of the pulse step, the positive charge on the electrode is neutralized by the electrons from the waveform generator, and therefore, a negative DC voltage is established on the substrate surface. If the formed DC voltage is held constant, then mono-energy ion bombardment is achieved. The negative DC voltage (Vdc) can be approximated by using the magnitude of the falling edge ($\Delta V$) and the ratio between the $C_{esc}$ and the sheath capacitance $C_{sheath}$ in accordance with the following equation:

$$V\text{dc} = \Delta V * C_{esc}/(C_{esc} + C_{sheath})$$

Generation Technique for Waveform Generation

As semiconductor device features shrink, atomic precision is often required during today's substrate processing techniques, such as plasma etching and plasma deposition techniques. For etching processes where the plasma ions play a major role, precise ion energy control is often required. Traditionally radio frequency (RF) biased approaches use a sinusoidal wave to excite plasma and accelerate ions. The ion energy distribution (IED) from conventional RF technology is typically of bimodal shape. Pulsing techniques have also been explored in recent years to generate IEDs with a mono-energy peak.

In some implementations, due to system complexity and equipment cost related issues, positive ion current is not compensated for during the ion current stage of the voltage waveform, and therefore, the negative voltage on the substrate decays with time (e.g., becoming less negative). In other words, as described with respect to waveform 200, without compensation, the substrate voltage rises during the ion current stage, also referred to herein as a voltage droop. This trend gets worse with increasing plasma density (e.g., increasing ion current), which cause the IED to expand or broaden towards the lower energy regime, as shown in FIG. 2C.

In some cases, a ramp voltage is generated to compensate for this voltage rise during portions of the ion current stage (e.g., at least during phase 205), by use of a current source or a plurality of voltage sources that are coupled to the electrode (e.g., electrode 104). However, at higher voltages (e.g., greater than 5 kV), it is challenging to generate custom-tailored waveforms with a ramp to compensate for this voltage rise.

In some embodiments, a high frequency voltage waveform may be used to lessen the impact of this voltage rise (i.e., droop) created during the ion current stage. With the current state of high voltage switches that are available on the market today, generating high frequency voltage pulse trains at pulse repetition frequency greater than 400 kHz is problematic, due to physical and practical device limitations found in these conventional components. Therefore, as briefly discussed above, switching speeds for these conventional high voltage switches are limited to a maximum practical switching speed due to damage created in these components at moderate to high frequencies due to heat generated during use. In certain embodiments of the present disclosure, time-domain multiplexing of voltage pulses is used to generate a waveform to be provided to a complex load (e.g., the electrostatic chuck and plasma 101 (FIG. 1) such that the load receives pulses at a higher frequency, mitigating the effects of the voltage droop at the substrate surface. For example, positive voltage pulses at a frequency of around 400 kHz may be used to periodically establish a negative direct current (DC) bias on the substrate, thereby obtaining IEDs with a mono-energy peak. In other words, by the time the voltage at the substrate surface voltage rises to a specific threshold during the ion current stage of a first voltage waveform pulse, a second voltage waveform pulse (e.g., from a different source or switches) may be applied, in effect resetting the voltage at the substrate surface during a following pulse cycle, as described in more detail herein.

Figure 3:
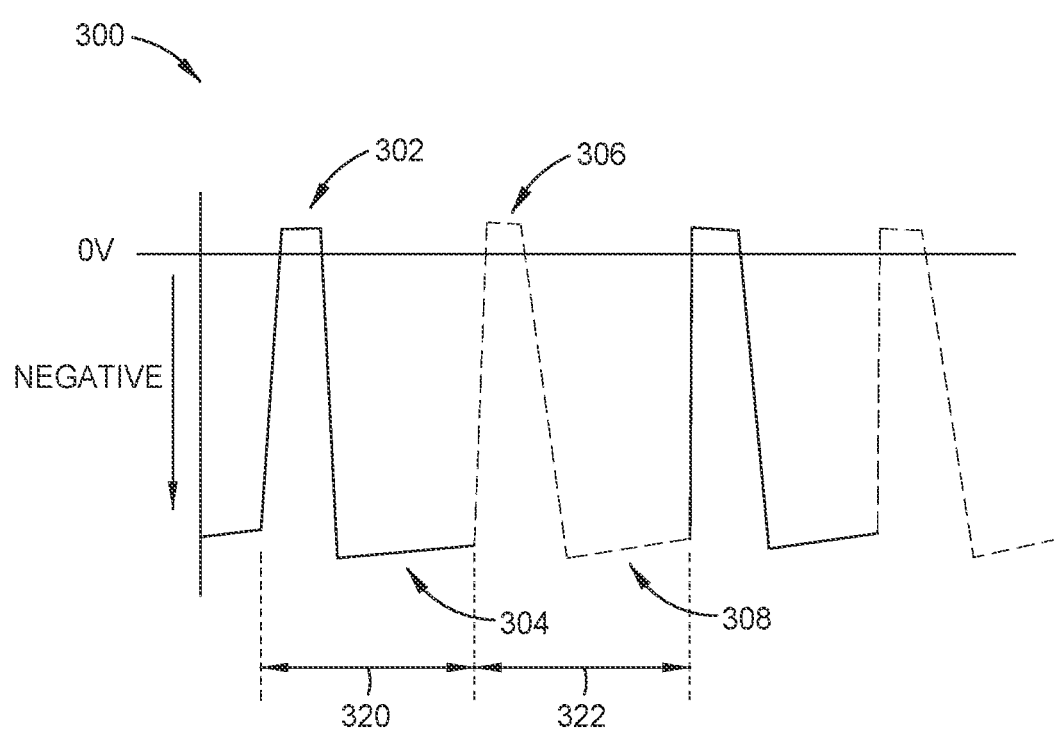
FIG. 3 illustrates an example waveform generated using time multiplexing of voltage pulses, in accordance with certain embodiments of the present disclosure.

FIG. 3 illustrates a pulsed voltage-biasing scheme using a waveform 300, in accordance with certain embodiments of the present disclosure. As shown, a first pulsed voltage cycle 320 and a second pulsed voltage cycle 322 may be time-multiplexed. To the electrostatic chuck and plasma 101, it appears that the frequency of the voltage pulse has increased due to the interleaving of the first pulsed voltage cycle 320 and the second pulsed voltage cycle 322. As the substrate voltage begins drooping during the ion current stage of the first voltage cycle, which is generated from a first PV source, a second pulse is generated by a second PV source, is applied, restoring the DC voltage bias (negative) on the substrate and restoring the falling ion energy caused by the droop.

In other words, the waveform 300 may include a positive voltage pulse 302 and a negative voltage pulse 304 for the first pulsed voltage cycle 320, followed by another positive voltage pulse 306 and another negative voltage pulse 308 for the second pulsed voltage cycle 322, as shown in FIG. 3. In some embodiments, the positive voltage pulse 302 and negative voltage pulse 304 may be generated using a switch pair (e.g., S1 and S3 in FIG. 4A), and the other positive voltage pulse 306 and other negative voltage pulse 308 may be generated using another switch pair (e.g., S2 and S4 in FIG. 4A). Using the different switch pairs allows for a higher frequency waveform as compared to conventional implementations where only a single switch pair is used for generation of positive and negative pulses. In other words, each switch may be implemented using one or more transistors, such as metal oxide semiconductor field-effect transistors (MOSFETs). Due to heating, each of the MOSFETs may have a switching frequency limit (e.g., maximum practical switching speed), preventing a single switch pair from generating pulses at a high frequency (e.g., 400 kHz). If a switch is operating at a frequency that is greater than the switching frequency limit of the switch, the voltage drop across the switch may increase due to an increase in the switch resistance resultant from the heat generated in the switch due to the presence of the high switching voltage. For example, the voltage drop across the switch may increase by 10% or more, depending on the switching frequency and type of switch. Moreover, if multiple switches are coupled in series, the drop across the switches accumulate. In other words, if three switches are coupled to in series (e.g., to implement switch S1, S2, S3, or S4), and the voltage drop across each switch increases by 10%, then the total voltage drop across the switches may increase by 30%. It is also believed that voltage drops across a switch that are 10% when comparing the voltage drop across a switch at a switch's switching frequency limit versus a time when the switch is initially placed into use, at the same switch input voltage, can lead to permanent damage to the components within the switch (e.g., increased switching resistance overtime) and/or significantly shorter than normal switch lifetimes.

Figure 4A:
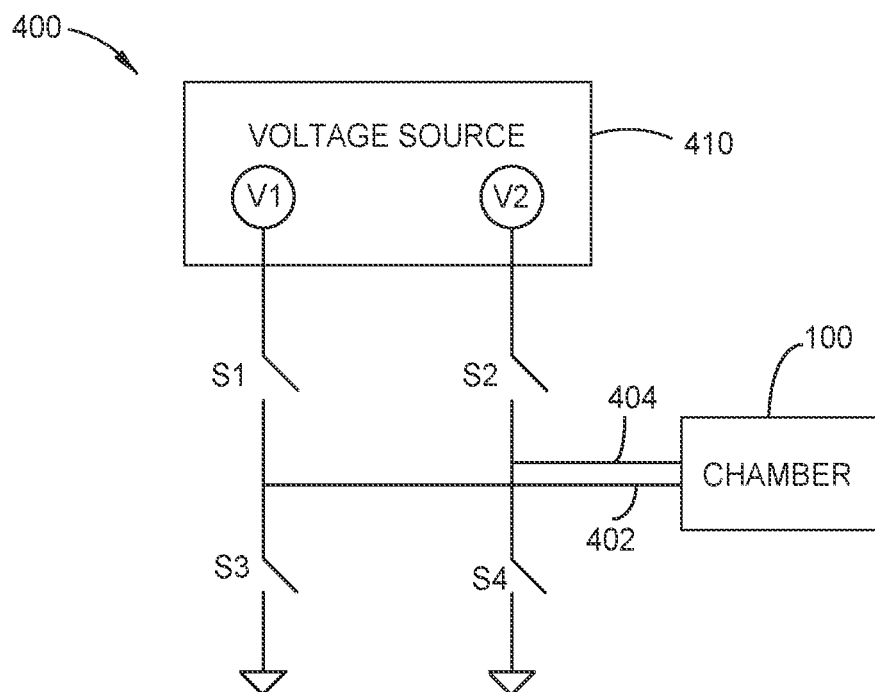
FIG. 4A illustrates an example waveform generator, in accordance with certain embodiments of the present disclosure.
Figure 4B:
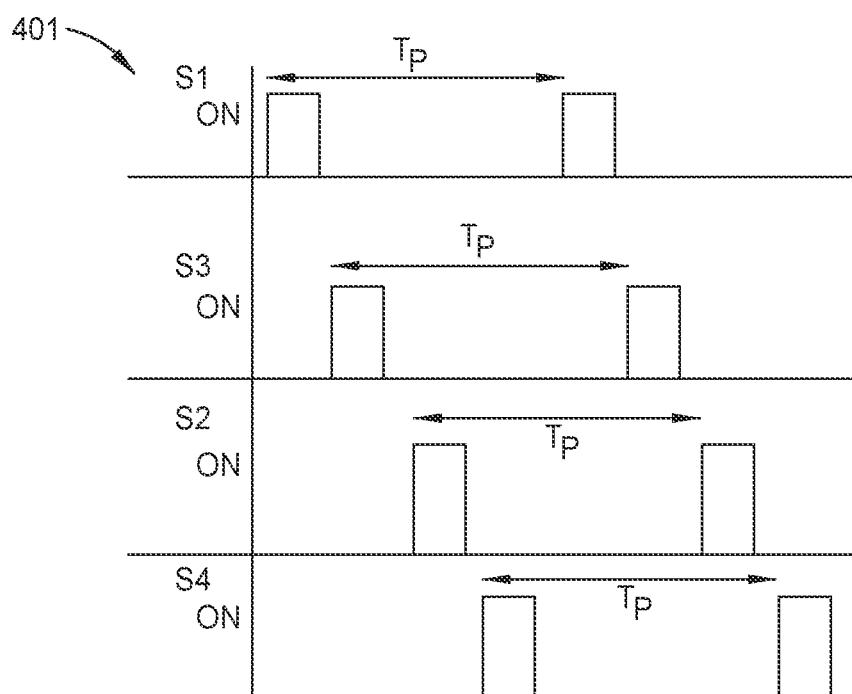
FIG. 4B is a timing diagram showing states of switches of the waveform generator of FIG. 4A.

FIG. 4A illustrates a waveform generator 400 for generating the pulses during the first and second pulsed voltage cycles 320, 322, in accordance with certain embodiments of the present disclosure. The waveform generator 400 may be part of the PV waveform generator 150. FIG. 4B is a timing diagram 401 showing the state of switches of the waveform generator 400.

As shown, switch S1 may be closed during a phase, coupling the waveform generator output node 402 to a voltage source V1 of the voltage source circuitry 410 and generating the positive voltage pulse 302. The switch S1 is then opened, and switch S3 is closed during a second phase, grounding the output node 402. Grounding the output node 402 results in the negative voltage pulse 304. In other words, during the positive voltage pulse 302, a capacitance between the output node 402 and the substrate charges. After the positive voltage pulse 302, the output node 402 is coupled to an electric ground node. Since the voltage across the capacitance between the output node 402 and the substrate cannot change instantaneously, the substrate voltage drops to a negative voltage in response to closure of switch S3.

After switch S3 is opened, switch S2 is closed during a third phase, coupling the voltage source V2 of the voltage source circuitry 410 to output node 404, in effect implementing the positive voltage pulse 306. Switch S2 is then opened, and switch S4 is closed during a fourth phase, coupling the output node 404 to the electrical ground node to implement the negative voltage pulse 308. The first, second, third, and fourth phases are non-overlapping phases, as shown by timing diagram 401. As shown, the phases may be repeated to generate a continuous time-multiplexed pulsed waveform that is delivered at a frequency that is greater than the maximum practical switching speed of each individual switch. In one example, if the maximum practical switching speed limit of each switch limits the switching frequency of each switch to a frequency of 400 kHz, a two voltage source configuration containing the same switches could deliver a time-multiplexed pulse train that has a frequency greater than 400 kHz and less than or equal to 800 kHz. In one non-limiting example, if the waveform generator 400 is asked to generate an 800 kHz pulse train, the switch combinations S1/S3 and S2/S4 are each separately used to provide the first and the second pulsed voltage cycles 320, 322, respectively, that will each have a period ($T_p$) that is 1.25 µs long, but are spaced 2.5 µs apart and staggered in time to form the desired pulse train.

In some embodiments, the output nodes 402, 404 may be coupled to the same node in the chamber. For example, the output nodes 402, 404 may be coupled to electrode 104. In some embodiments, the output nodes 402, 404 may be coupled to different nodes in the chamber. For example, the output node 402 may be coupled to electrode 104 and the output node 404 may be coupled to electrode 115.

In some embodiments, a first voltage source circuitry 410 of a waveform generator 400 forms part of the PV waveform generator 150 (FIG. 1) of the first PV source assembly 196. In another embodiment, a first voltage source circuitry 410 of a waveform generator 400 forms part of the PV waveform generator 150 of the first PV source assembly 196, and a second voltage source circuitry 410 of a waveform generator 400 forms part of the PV waveform generator 150 of the second PV source assembly 197. In yet another embodiment, a first voltage source circuitry 410 of a waveform generator 400 forms part of the PV waveform generator 150 of the first PV source assembly 196, a second voltage source circuitry 410 of a waveform generator 400 forms part of the PV waveform generator 150 of the second PV source assembly 197, and/or a third voltage source circuitry 410 of a waveform generator 400 forms part of the PV waveform generator 150 of a third PV source assembly 198 that is coupled to the lid 123. In either of these configurations, and where appropriate, the output nodes 402, 404 of the first voltage source circuitry 410 are coupled to electrode 104, the output nodes 402, 404 of the second voltage source circuitry 410 are coupled to electrode 115, and/or the output nodes 402, 404 of the third voltage source circuitry 410 are coupled to lid 123.

In some embodiments, the voltage source circuitry 410 may include a first voltage source V1 coupled to the switch S1 and a second voltage source V2 coupled to the switch S2. Each of the first and second voltage sources may be implemented using a capacitive element that is charged to a specific voltage by a power source. In some embodiments, the first and second voltage sources V1 or V2 of each voltage source circuitry 410 may provide different voltages or the same voltage.

While the examples provided herein have described two switch pairs to facilitate understanding, the embodiments of the present disclosure may be implemented with more than two switch pairs. For example, in addition to the first switch pair (e.g., S1 and S3) and the second switch pair (e.g., S2 and S4), a third switch pair may be implemented for generating positive and negative pulses, allowing for a higher frequency of operation. In other words, after switch S2 and switch S4 are used to generate the positive voltage pulse 306, and negative voltage pulse 308, the third switch pair may be used to generate another positive pulse and another negative pulse before the switch S1 and switch S3 are used to generate the positive voltage pulse 302, and negative voltage pulse 304 again. Thus, in some embodiments, a plurality of switch pairs are utilized in a serial and repeating cycle to form a pulse train that has a frequency that is greater than the maximum practical switching speed of each individual switch, such that the maximum frequency of the pulse train is equal to N times the maximum frequency of each switch or at least the slowest switch of the plurality of switches, where N is equal to the number of switch pairs of the plurality of switch pairs. Operating each of the switch pairs during different phases of the generated pulse train allows for the implementation of a high frequency waveform for plasma processing. Using a higher frequency waveform allows for the voltage droop (e.g., increasing voltage during the ion current stage) to be reduced, increasing plasma processing precision.

Figure 5:
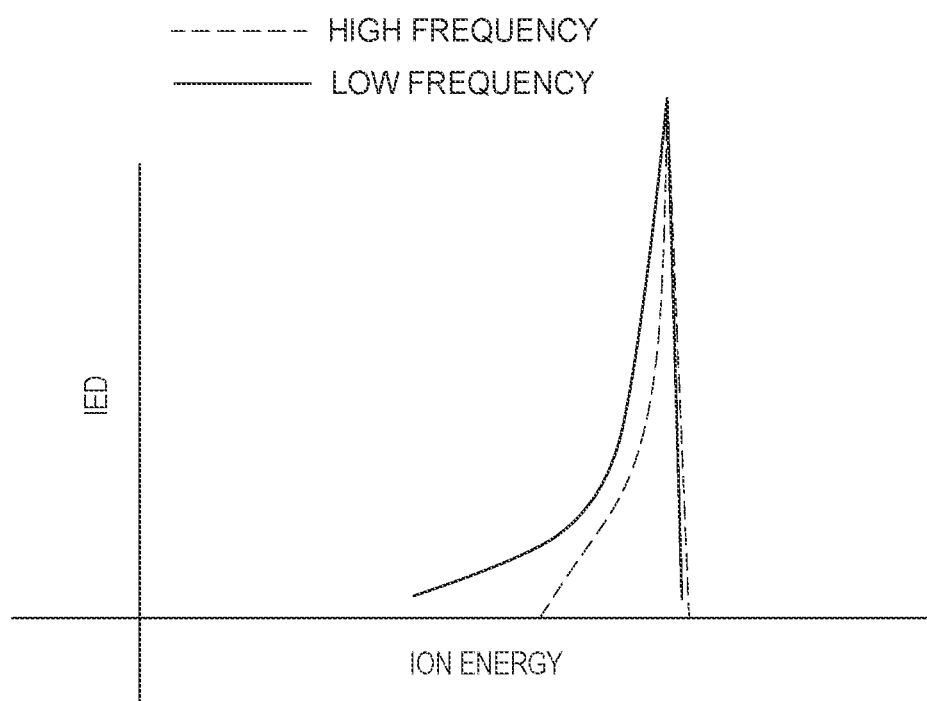
FIG. 5 illustrates the IED associated with the waveform shown in FIG. 3, in accordance with certain embodiments of the present disclosure.

FIG. 5 illustrates the ion energy distribution (IED) associated with the waveform 300, in accordance with certain embodiments of the present disclosure. As shown, when generating the waveform at a higher frequency (e.g., 400 kHz), a narrower IED may be obtained as compared to a lower frequency waveform (e.g., waveform 200 of FIG. 2A having a frequency of 200 kHz). The narrower IED facilitates a greater feature formation precision, for example, during typical etching plasma processes.

Figure 6:
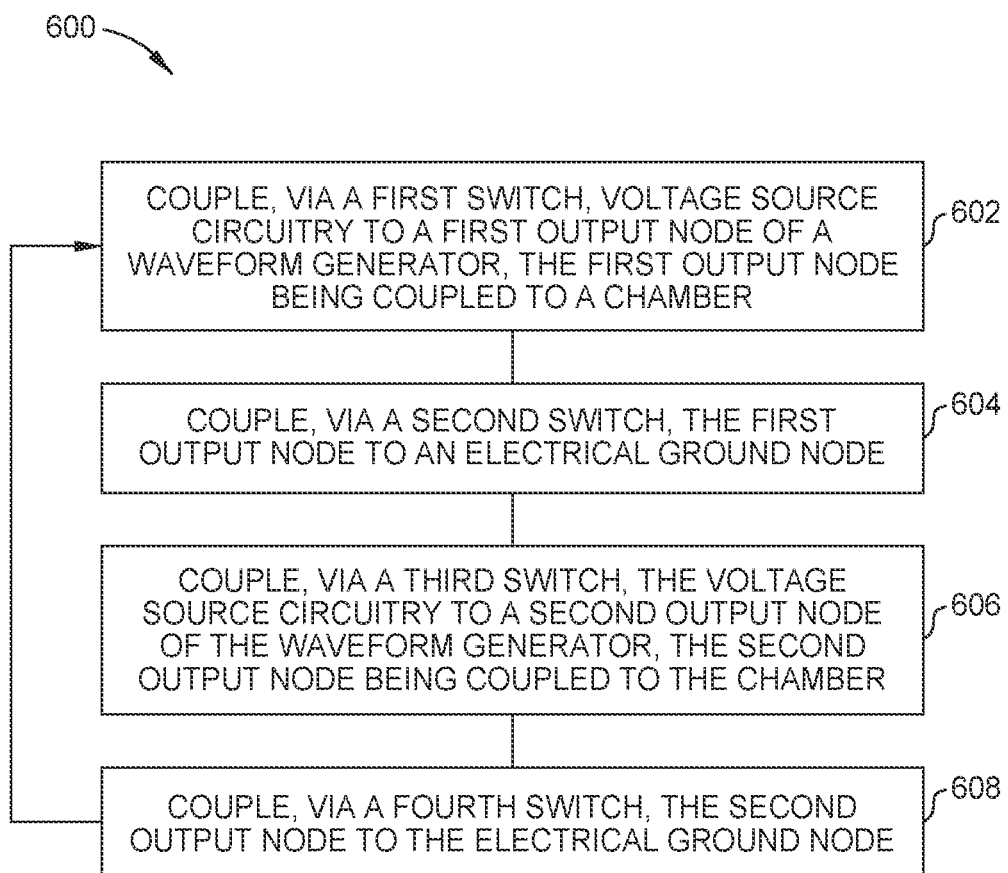
FIG. 6 is a process flow diagram illustrating a method for waveform generation.

FIG. 6 is a process flow diagram illustrating a method 600 for waveform generation. The method 600 may be performed by a waveform generation system including a waveform generator, such as the waveform generator 400, and a system controller such as the system controller 126.

The method 600 begin, at activity 602, with the waveform generation system coupling, via a first switch (e.g., switch S1), voltage source circuitry (e.g., voltage source circuitry 410) to a first output node (e.g., output node 402) of a waveform generator (e.g., waveform generator 400), the first output node being coupled to a chamber (e.g., chamber 100). At activity 604, the waveform generation system couples, via a second switch (e.g., switch S3), the first output node to an electrical ground node. At activity 606, the waveform generation system couples, via a third switch (e.g., switch S2), the voltage circuitry to a second output node (e.g. output node 404) of the waveform generator, the second output node being coupled to the chamber. At activity 608, the waveform generation system couples, via a fourth switch (e.g., switch S4), the second output node to the electrical ground node. In some embodiments, the activities 602, 604, 606, 608 may be repeated to generate a waveform for plasma processing.

In some embodiments, a first pulsed voltage waveform (e.g., including the positive voltage pulse 302 and the negative voltage pulse 304) is generated at the chamber by the coupling via the first switch and the second switch. Moreover, a second pulsed voltage waveform (e.g., including the positive voltage pulse 306 and the negative voltage pulse 308) is generated at the chamber by the coupling via the third switch and the fourth switch. The first pulsed voltage waveform may be phase shifted (e.g., by 180°) from the second pulsed voltage waveform.

In some embodiments, the coupling via the first switch, the second switch, the third switch, and the fourth switch is during non-overlapping phases. For example, the voltage source circuitry is coupled to the first output node during a first phase of the non-overlapping phases, and the first output node is coupled to the electrical ground node during a second phase of the non-overlapping phases, the second phase being after the first phase. Moreover, the voltage source circuitry is coupled to the second output node during a third phase of the non-overlapping phases, the third phase being after the second phase, and the second output node is coupled to the electrical ground node during a fourth phase of the non-overlapping phases, the fourth phase being after the third phase.

In some embodiments, the voltage source circuitry includes a first voltage source (e.g., voltage source V1) coupled to the first switch and a second voltage source (e.g., voltage source V2) coupled to the second switch. The first voltage source may include a first capacitive element, and the second voltage source may include a second capacitive element. Each of the first switch, the second switch, the third switch, and the fourth switch may include one or more transistors (e.g., MOSFETs).

In some embodiments, the waveform generation system may generate a first positive voltage pulse (e.g., positive voltage pulse 302) at a node (e.g., at a substrate) in the chamber by coupling the voltage source circuitry to the first output node, and generate a first negative voltage pulse (e.g., negative voltage pulse 304) at the node in the chamber by coupling the first output node to the electrical ground node. Moreover, the waveform generation system may generate a second positive voltage pulse (e.g., positive voltage pulse 306) at the node in the chamber by coupling the voltage source circuitry to the second output node, and generate the second negative voltage pulse (e.g., negative voltage pulse 308) at the node in the chamber by coupling the second output node to the electrical ground node.

The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A waveform generator for plasma processing, comprising:
   voltage source circuitry;
   a first switch coupled between the voltage source circuitry and a first output node of the waveform generator, the first output node being configured to be coupled to a chamber;
   a second switch coupled between the first output node and electrical ground node;
   a third switch coupled between the voltage source circuitry and a second output node of the waveform generator, the second output node being configured to be coupled to the chamber; and
   a fourth switch coupled between the second output node and the electrical ground node.

2. The waveform generator of claim 1, wherein:
   the first switch and the second switch are configured to generate a first pulsed voltage waveform to be provided to the chamber; and
   the third switch and the fourth switch are configured to generate a second pulsed voltage waveform to be provided to the chamber, the first pulsed voltage waveform being phase shifted from the second pulsed voltage waveform.

3. The waveform generator of claim 1, wherein the first switch, the second switch, the third switch, and the fourth switch are configured to be closed during non-overlapping phases.

4. The waveform generator of claim 3, wherein:
   the first switch is configured to be closed during a first phase of the non-overlapping phases;
   the second switch is configured to be closed during a second phase of the non-overlapping phases, the second phase being after the first phase;
   the third switch is configured to be closed during a third phase of the non-overlapping phases, the third phase being after the second phase; and
   the fourth switch is configured to be closed during a fourth phase of the non-overlapping phases, the fourth phase being after the third phase.

5. The waveform generator of claim 1, wherein the voltage source circuitry comprises a first voltage source coupled to the first switch and a second voltage source coupled to the second switch.

6. The waveform generator of claim 5, wherein the first voltage source comprises a first capacitive element, and wherein the second voltage source comprises a second capacitive element.

7. The waveform generator of claim 1, wherein each of the first switch, the second switch, the third switch, and the fourth switch comprises one or more transistors.

8. The waveform generator of claim 1, wherein the first output node is coupled to the second output node.

9. The waveform generator of claim 8, wherein the first output node and the second output node are coupled to an electrode disposed below a substrate supporting surface of a substrate support disposed within the chamber.

10. The waveform generator of claim 9, wherein at least one of the first switch, the second switch, the third switch, or the fourth switch has a switching frequency limit, and wherein the waveform generator is configured to generate a waveform at the electrode having a frequency that is greater than the switching frequency limit.

11. A method for waveform generation, comprising:
coupling, via a first switch, voltage source circuitry to a first output node of a waveform generator, the first output node being coupled to a chamber;
coupling, via a second switch, the first output node to an electrical ground node;
coupling, via a third switch, the voltage source circuitry to a second output node of the waveform generator, the second output node being coupled to the chamber; and
coupling, via a fourth switch, the second output node to the electrical ground node.

12. The method of claim 11, where:
a first pulsed voltage waveform is generated at the chamber by the coupling via the first switch and the second switch; and
a second pulsed voltage waveform is generated at the chamber by the coupling via the third switch and the fourth switch, the first pulsed voltage waveform being phase shifted from the second pulsed voltage waveform.

13. The method of claim 11, wherein the coupling via the first switch, the second switch, the third switch, and the fourth switch are during non-overlapping phases.

14. The method of claim 13, wherein:
the voltage source circuitry is coupled to the first output node during a first phase of the non-overlapping phases;
the first output node is coupled to the electrical ground node during a second phase of the non-overlapping phases, the second phase being after the first phase;
the voltage source circuitry is coupled to the second output node during a third phase of the non-overlapping phases, the third phase being after the second phase; and
the second output node is coupled to the electrical ground node during a fourth phase of the non-overlapping phases, the fourth phase being after the third phase.

15. The method of claim 11, wherein the voltage source circuitry comprises a first voltage source coupled to the first switch and a second voltage source coupled to the third switch.

16. The method of claim 15, wherein the first voltage source comprises a first capacitive element, and wherein the second voltage source comprises a second capacitive element.

17. The method of claim 11, wherein each of the first switch, the second switch, the third switch, and the fourth switch comprises one or more transistors.

18. The method of claim 11, further comprising:
generating a first positive voltage pulse at a node in the chamber by coupling the voltage source circuitry to the first output node;
generating a first negative voltage pulse at the node in the chamber by coupling the first output node to the electrical ground node;
generating a second positive voltage pulse at the node in the chamber by coupling the voltage source circuitry to the second output node; and
generating a second negative voltage pulse at the node in the chamber by coupling the second output node to the electrical ground node.

19. The method of claim 11, wherein the first output node and the second output node are coupled to an electrode disposed below a substrate supporting surface of a substrate support disposed within the chamber.

20. The method of claim 19, wherein at least one of the first switch, the second switch, the third switch, or the fourth switch has a switching frequency limit, the method further comprising generating a waveform at the electrode having a frequency that is greater than the switching frequency limit.

21. An apparatus for waveform generation, comprising:
voltage source circuitry;
one or more switches coupled to the voltage source circuitry; and
a controller configured to control the one or more switches, wherein the one or more switches include:
a first switch coupled between the voltage source circuitry and a first output node of the waveform generator, the first output node being configured to be coupled to a chamber;
a second switch coupled between the first output node and electrical ground node;
a third switch coupled between the voltage source circuitry and a second output node of the waveform generator, the second output node being configured to be coupled to the chamber; and
a fourth switch coupled between the second output node and the electrical ground node.

22. The apparatus of claim 21, wherein the controller is configured to close the first switch, the second switch, the third switch, and the fourth switch during non-overlapping phases.

23. The apparatus of claim 22, wherein the controller is configured to:
close the first switch during a first phase of the non-overlapping phases;
close the second switch during a second phase of the non-overlapping phases, the second phase being after the first phase;
close the third switch during a third phase of the non-overlapping phases, the third phase being after the second phase; and
close the fourth switch during a fourth phase of the non-overlapping phases, the fourth phase being after the third phase.

24. The apparatus of claim 21, wherein the voltage source circuitry comprises a first voltage source coupled to the first switch and a second voltage source coupled to the third switch.

25. The apparatus of claim 21, wherein the first output node and the second output node are coupled to an electrode disposed below a substrate supporting surface of a substrate support disposed within the chamber.

26. The apparatus of claim 25, wherein at least one of the first switch, the second switch, the third switch, or the fourth switch has a switching frequency limit, and wherein the apparatus is configured to generate a waveform at the electrode having a frequency that is greater than the switching frequency limit.

* * * * *